United States Patent
Senegond et al.

(10) Patent No.: US 12,172,187 B2
(45) Date of Patent: Dec. 24, 2024

(54) ULTRASOUND TRANSDUCER MANUFACTURING METHOD

(71) Applicant: VERMON SA, Tours (FR)

(72) Inventors: Nicolas Senegond, Tours (FR); Dominique Gross, Tours (FR); Cyril Meynier, Tours (FR)

(73) Assignee: VERMON SA, Tours (FR)

( * ) Notice: Subject to any disclaimer, the term of this patent is extended or adjusted under 35 U.S.C. 154(b) by 366 days.

(21) Appl. No.: 17/636,198

(22) PCT Filed: Aug. 14, 2020

(86) PCT No.: PCT/IB2020/000716
§ 371 (c)(1),
(2) Date: Feb. 17, 2022

(87) PCT Pub. No.: WO2021/033031
PCT Pub. Date: Feb. 25, 2021

(65) Prior Publication Data
US 2022/0280971 A1 Sep. 8, 2022

Related U.S. Application Data

(60) Provisional application No. 62/889,384, filed on Aug. 20, 2019.

(51) Int. Cl.
*B06B 1/02* (2006.01)
(52) U.S. Cl.
CPC .................. *B06B 1/0292* (2013.01)
(58) Field of Classification Search
CPC .................................................. B06B 1/0292
See application file for complete search history.

(56) References Cited

U.S. PATENT DOCUMENTS

2002/0166218 A1 11/2002 Barber
2011/0062535 A1 3/2011 McMullen et al.
(Continued)

FOREIGN PATENT DOCUMENTS

EP 2 682 196 A1 1/2014

OTHER PUBLICATIONS

European Patent Office, International Search Report issued in corresponding Application No. PCT/IB2020/000716, mailed Dec. 17, 2020.

*Primary Examiner* — Isam A Alsomiri
*Assistant Examiner* — Abdallah Abulaban
(74) *Attorney, Agent, or Firm* — Stites & Harbison, PLLC; Jeffrey A. Haeberlin

(57) ABSTRACT

The present disclosure relates to a method of simultaneous manufacturing, from a same substrate (101), at least one first CMUT transducer (I) having a first resonance frequency and at least one second CMUT transducer (II) having a second resonance frequency different from the first frequency, the method comprising the steps of: a) for each transducer (I, II), forming a cavity (103) on the upper surface side of the substrate, and forming a flexible membrane (105) suspended above the cavity (103); b) forming a first layer (109) extending over a portion only of the upper surface of the membrane (105) of the first transducer (I) and which does not extend over the membrane (105) of the second transducer (II); and c) forming a second layer (111) extending over the entire upper surface of the membrane (105) of the first transducer and over the entire upper surface of the membrane of the second transducer.

15 Claims, 3 Drawing Sheets

(56) References Cited

U.S. PATENT DOCUMENTS

2014/0010052 A1\* 1/2014 Torashima ............ B06B 1/0292
  367/181
2015/0215705 A1\* 7/2015 Kang .................... H04R 17/00
  381/190

\* cited by examiner

ULTRASOUND TRANSDUCER MANUFACTURING METHOD

TECHNICAL BACKGROUND

The present disclosure generally relates to the field of ultrasound transducers and, more particularly, to that of capacitive micromachined ultrasonic transducers, also called CMUT transducers.

PRIOR ART

Conventionally, a CMUT transducer comprises a flexible membrane suspended above a cavity, a first electrode, called lower electrode, located on the side of the cavity opposite to the membrane, and a second electrode, called upper electrode, located on the side of the cavity opposite to the first electrode and rigidly attached to the flexible membrane. In operation, a DC bias voltage is applied between the lower and upper electrodes of the transducer. When an appropriate AC excitation voltage, superimposed to the DC bias voltage, is applied between the lower and upper electrodes of the transducer, the flexible membrane starts vibrating under the effect of the variation of the electrostatic force exerted between the lower and upper electrodes, causing the emission of an ultrasound acoustic wave. Conversely, when the transducer receives an ultrasound acoustic wave, the flexible membrane starts vibrating under the effect of the mechanical pressure variation, causing the occurrence, between the lower and upper electrodes of the transducer, of an AC voltage superimposed to the DC bias voltage (due to the capacitance variation between the electrodes).

A CMUT transducer is conventionally coupled to an electronic control circuit configured to, during a transmission phase, apply between the transducer electrodes an excitation voltage superimposed to a DC bias voltage, to cause the transmission of an ultrasound wave by the transducer and, during a reception phase, apply between the transducer electrodes a DC bias voltage and read between said electrodes an AC voltage generated under the effect of a received ultrasound wave.

The transmit frequency of a CMUT transducer generally corresponds to its resonance frequency, which depends on various parameters and in particular on the geometric and mechanical characteristics of the membrane and of the cavity.

For certain applications, it may be desirable to be able to simultaneously form, on a same substrate, transducers intended to operate at different ultrasound frequencies.

SUMMARY

To achieve this, an embodiment provides a method of simultaneous manufacturing, from a same substrate, at least one first CMUT transducer having a first resonance frequency and at least one second CMUT transducer having a second resonance frequency different from the first frequency, the method comprising the steps of:
  a) for each transducer, forming a cavity on the upper surface side of the substrate, and forming a flexible membrane suspended above the cavity;
  b) forming a first layer extending over a portion only of the upper surface of the membrane of the first transducer and which does not extend over the membrane of the second transducer; and
  c) forming a second layer extending over the entire upper surface of the membrane of the first transducer and over the entire upper surface of the membrane of the second transducer.

According to an embodiment, the first and second layers are electrically-conductive layers.

According to an embodiment, the first and second layers are metal layers.

According to an embodiment, the first and second layers respectively are a dielectric layer and an electrically-conductive layer.

According to an embodiment, at step a), each cavity is formed in a third dielectric layer previously formed on the upper surface of the substrate.

According to an embodiment, the membranes are formed in a fourth semiconductor layer placed on the upper surface of the third layer.

According to an embodiment, the substrate is a semiconductor substrate.

According to an embodiment, the pattern formed by the first layer in the first transducer is arranged above a central portion of the transducer cavity.

According to an embodiment, the cavities of the first and second transducers formed at step a) have the same depth, to within manufacturing dispersions.

An embodiment provides a device comprising, inside and on top of a same substrate, at least one first CMUT transducer having a first resonance frequency and at least one second CMUT transducer having a second resonance frequency different from the first frequency, wherein:
  each transducer comprises a cavity on the upper surface side of the substrate, and a flexible membrane suspended above the cavity;
  a first layer extends over a portion only of the upper surface of the membrane of the first transducer and does not extend over the membrane of the second transducer; and
  a second layer extends over the entire upper surface of the membrane of the first transducer and over the entire upper surface of the membrane of the second transducer.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various possible applications of the described transducers have not been detailed, the described embodiments being compatible with usual applications of ultrasound transducers, particularly in ultrasound imaging devices. Further, the circuits for controlling the described transducers have not been detailed, the described embodiments being compatible with all or most known CMUT transducer control circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1A:
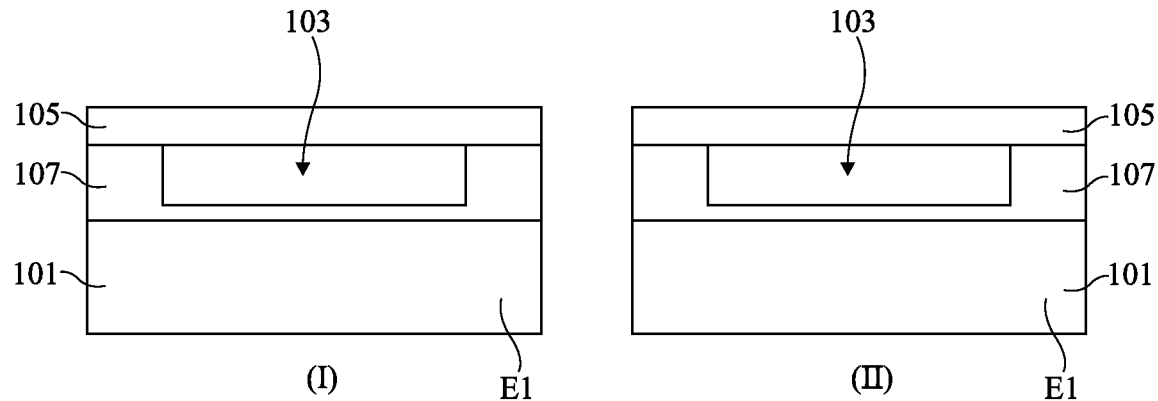
FIGS. 1A, 1B, and 1C are cross-section views illustrating successive steps of an example of an ultrasound transducer manufacturing method according to an embodiment.
Figure 1B:
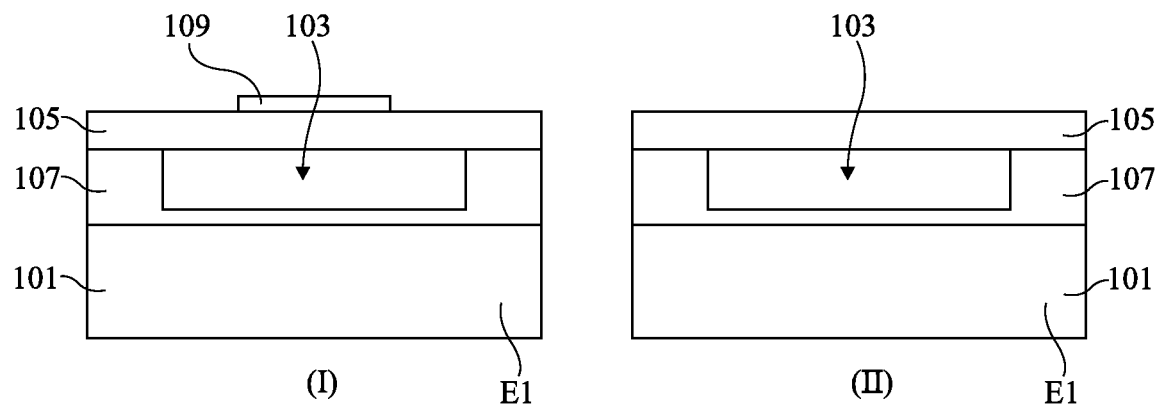
Figure 1C:
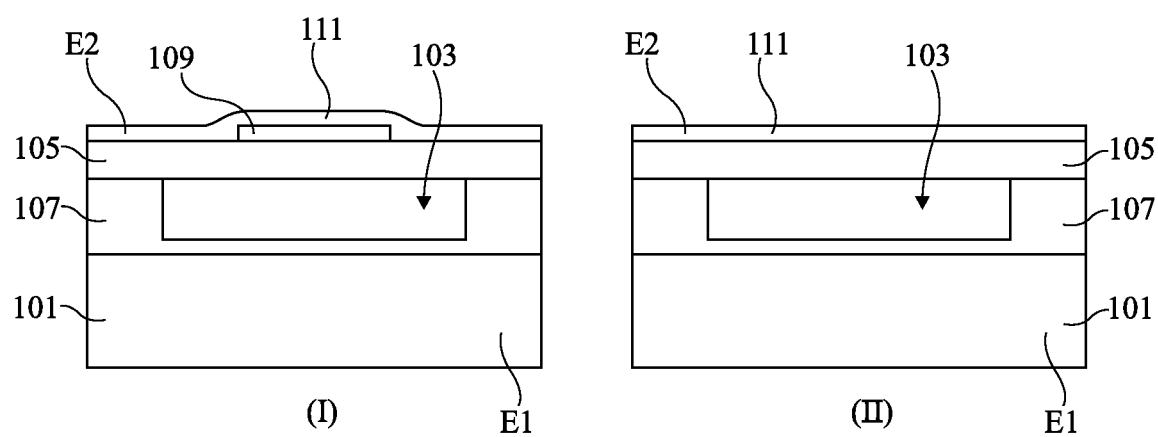

FIGS. 1A, 1B, and 1C are cross-section views illustrating successive steps of an example of a CMUT transducer manufacturing method according to an embodiment. This method enables to simultaneously form, inside and/or on top of a same substrate 101, CMUT transducers of a first type (I) and CMUT transducers of a second type (II), capable of operating at different respective ultrasound frequencies. FIGS. 1A to 1C only show the forming of a single type-I transducer (in the left-hand portion of the drawings) and of a single type-II transducer (in the right-hand portion of the drawings). In practice, a plurality of type-I transducers and a plurality of type-II transducers, for example, respectively identical to within manufacturing dispersions, may be simultaneously formed from a same substrate.

FIG. 1A illustrates the structure obtained at the end of a step of forming, for each transducer, a cavity 103 on the upper surface side of substrate 101, and a flexible membrane 105 suspended above cavity 103.

Substrate 101 is for example a doped semiconductor substrate 101, for example, made of silicon, defining a lower electrode E1 of the transducer.

In this example, cavities 103 are formed in a dielectric layer 107, for example, made of silicon oxide, previously formed on the upper surface of substrate 101. Layer 107 is for example directly in contact, by its lower surface, with the upper surface of substrate 101. Each cavity 103 extends vertically from the upper surface of dielectric layer 107, towards the upper surface of substrate 101. In the shown example, cavities 103 are non-through, that is, they do not emerge on the lower surface side of layer 107. In other words, a lower portion of the thickness of layer 107 coats the upper surface of substrate 101 at the bottom of each cavity 103. The described embodiments are however not limited to this specific case.

Dielectric layer 107 for example initially extends continuously and across a substantially uniform thickness all over the upper surface of substrate 101. As an example, dielectric layer 107 may be formed by oxidation of an upper portion of substrate 101, for example, according to a dry oxidation method, or by deposition of a dielectric material on the upper surface of substrate 101.

Cavities 103 may be formed by local etching of dielectric layer 107 from its upper surface.

Preferably, the cavities 103 of the type-I and -II transducers are formed simultaneously and have the same depth, to within manufacturing dispersions. As an example, the depth of cavities 103 is in the range from 10 nm to 5 µm, for example, in the order of 500 nm.

The cavities 103 of the type-I and -II transducers may have the same lateral dimensions (to within manufacturing dispersions), or different lateral dimensions. The lateral dimensions of cavities 103 are for example in the range from 5 to 500 µm.

In each transducer, membrane 105 extends above cavity 103 and is attached, at the periphery of cavity 103, by its lower surface, to the upper surface of dielectric layer 107. As an example, the lower surface of membrane 105 is directly in contact with the upper surface of dielectric layer 107 at the periphery of cavity 103.

Membranes 105 may be placed on the upper surface of dielectric layer 107 after the forming of cavities 103. Membranes 105 are for example made of a doped or non-doped semiconductor material, for example, of silicon. Membranes 107 are for example attached by direct bonding or molecular bonding of their lower surface to the upper surface of dielectric layer 107. Preferably, the membranes 105 of the type-I and -II transducers are simultaneously formed and arranged and have the same thickness, to within manufacturing dispersions. As an example, membranes 105 may correspond to portions of a semiconductor layer of a SOI-type (semiconductor on insulator) stack. The SOI stack may be attached to the upper surface of dielectric layer 107, for example, by direct bonding or molecular bonding, and then thinned from its surface opposite to dielectric layer 107 to only keep the semiconductor layer forming membranes 105. The thickness of membranes 105 is for example in the range from 10 nm to 10 µm.

FIG. 1B illustrates the structure obtained at the end of a step of forming a first layer 109 of a first material extending on a portion only of the upper surface of the membrane of each type-I transducer, and which does not extend over the membrane of the type-II transducers.

As an example, layer 109 is first continuously deposited with a substantially uniform thickness all over the upper surface of the structure of FIG. 1A, and then locally removed, for example, by photolithography and etching, to form a pattern extending over a portion only of the membrane of each type-I transducer and which does not extend over the membrane of the type-II transducers. In other words, layer 109 is entirely removed above the cavity 103 of each type-II transducer, and is removed above a portion only of the surface of the cavity 103 of each type-I transducer. In each type-I transducer, layer 109 is for example directly in contact, by its lower surface, with the upper surface of membrane 105 of the transducer, all over the portion of membrane 105 covered with layer 109.

FIG. 1C illustrates the structure obtained at the end of a step of forming a second layer 111 of a second material on the upper surface of the structure of FIG. 1B. Layer 111 may be made of the same material as layer 109 or of a different material. Layer 111 continuously extends with a substantially uniform thickness over the entire upper surface of the membrane 105 of each transducer. In type-I transducers, layer 111 is for example in contact, by its lower surface, on the one hand with the upper surface of layer 109 on the portion of membrane 105 covered with layer 109, and on the other hand with the upper surface of membrane 105 on the portion of membrane 105 which is not covered with layer 109. In type-II transducers, layer 111 is for example in contact, by its lower surface, with the upper surface of membrane 105 over substantially the entire surface of membrane 105.

Layers 109 and 111 are preferably electrically-conductive layers, for example, metal layers. Layer 111 particularly defines, in each transducer, an upper contact electrode E2 of the transducer. As an example, each of layers 109 and 111 is made of a material from the group comprising aluminum, copper, gold, tungsten, titanium, nickel, or an alloy of one or a plurality of these materials. As a variant, layer 109 may be made of a dielectric material, for example, silicon oxide or silicon nitride. Layers 109 and 111 may have the same thickness (to within manufacturing dispersions), or different thicknesses. Each of layers 109 and 111 for example has a thickness in the range from 1 nm to 5 µm.

The layers 109 and 111 coating the transducer membranes 105 induce a mechanical stress capable of causing, in the absence of any electric biasing of the transducer, a deflection (not shown in FIG. 1C) of the membranes, called initial deflection hereafter. Such a mechanical stress and the resulting initial deflection particularly depend on the thickness, the nature of the materials, and on the conditions of deposition (deposition temperature in particular) of layers 109 and 105.

In type-I transducers, layer 109 generates, due to its location on a portion only of the surface of membrane 105, a discontinuity in the stack coating membrane 105. This results in a discontinuity of the neutral (non-mechanically stressed) plane of the membrane. This generates, at the level of the discontinuity, additional mechanical stress resulting in significantly increasing the initial deflection of the membrane with respect to type-II transducers having no such discontinuity.

Such an increased initial deflection results in a decrease in the collapse voltage or pull-in voltage of the transducer, that is, the threshold voltage between electrodes E1 and E2 from which flexible membrane 105 comes into contact, by its lower surface, with the bottom of cavity 103.

A further effect of the additional layer 109 is an increase of the stiffness of the membrane and then, an increase in the resonance frequency of the transducer.

According to an aspect of the described embodiments, advantage is taken from the introduction of a structured layer (layer 109 in the example of FIGS. 1A to 1C) into the stack coating membrane 105, to obtain an additional degree of freedom enabling to simultaneously form, by a common method and from a same substrate, transducers capable of operating at different ultrasound frequencies.

In particular, the method described in relation with FIGS. 1A to 1C enables to form type-I transducers having a resonance frequency greater than that of the type-II transducers, and this, for a same DC bias voltage applied between their respective electrodes E1 and E2.

Preferably, to increase the resonance frequency difference between type-I transducers and type-II transducers, structured layer 109 is deposited in conditions capable of generating relatively high mechanical stress on the membranes 105 of type-I transducers. As an example, layer 109 is deposited at a relatively high temperature, for example, in the range from 100 to 450° C. Further, a thermal treatment may be applied subsequently to the deposition of layer 109 or of layer 111 to increase the stress. For example, after the deposition of layer 109 or of layer 111, a relatively significant temperature variation, for example, a temperature variation in the range from 300 to 800° C., may be applied to the structure. More generally, those skilled in the art will understand how to tune the process in order to obtain a desired resonance frequency, by trapping constraints of thermal expansion in the stack of layers.

The pattern of the portion of layer 109 arranged on the membrane of the type-I transducers contributes to defining the initial deflection and, indirectly, the resonance frequency of the type-I transducers. As an example, the portion of layer 109 kept above the membrane 105 of each type-I transducer may have, in top view (not shown), a general square or circular shape arranged on a central portion of the membrane. As a variant, the portion of layer 109 may have the shape of a ring arranged on a peripheral portion of the membrane. In another variant, a plurality of separate portion of layer 109 may be arranged above distinct regions of the membrane 105 of each type-I transducer.

Figure 2A:
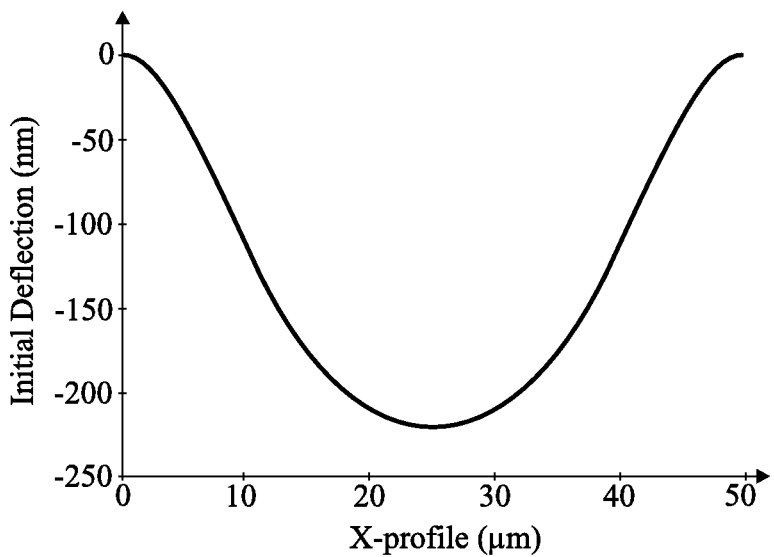
FIGS. 2A and 2B are plots showing the initial deflection of first and second types of ultrasound transducers formed by the method of FIGS. 1A to 1C.
Figure 2B:
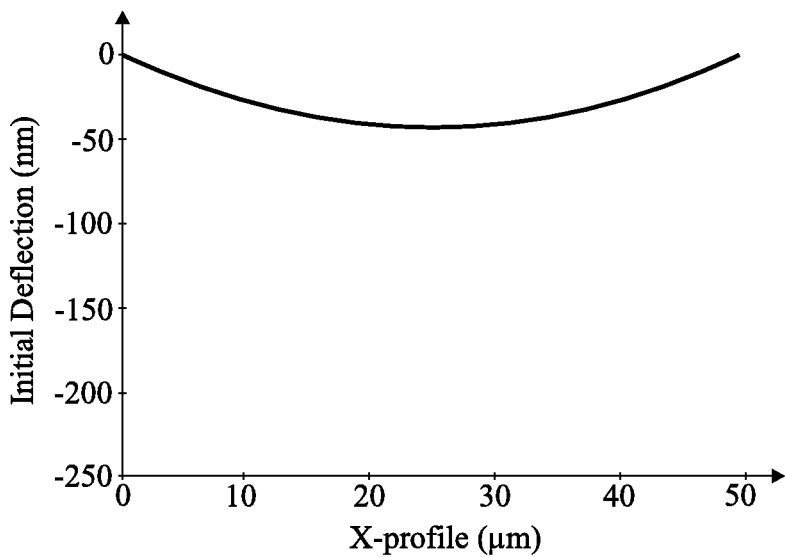

FIGS. 2A and 2B are diagrams respectively showing, for a type-I transducer and for a type-II transducer formed by a method of the type described in relation with FIGS. 1A to 1C, the initial deflection of membrane 105 of the transducer (in ordinates, in nm) along a lateral dimension (in abscissas, in µm) of the membrane.

A type-I transducer and a type-II transducer having membranes of identical lateral dimensions (to within manufacturing dispersions), in the order of 50 µm, has been considered in this example. In this example, the only difference between the type-I transducer and the type-II transducer lies in the presence of layer 109 on a portion of the surface of the membrane 105 of the type-I transducer and in the absence of layer 109 on the membrane of the type-II transducer.

An initial deflection at the center of the membrane in the order of 225 nm for the type-I transducer, and in the order of 50 nm for the type-II transducer, can be observed.

Figure 3A:
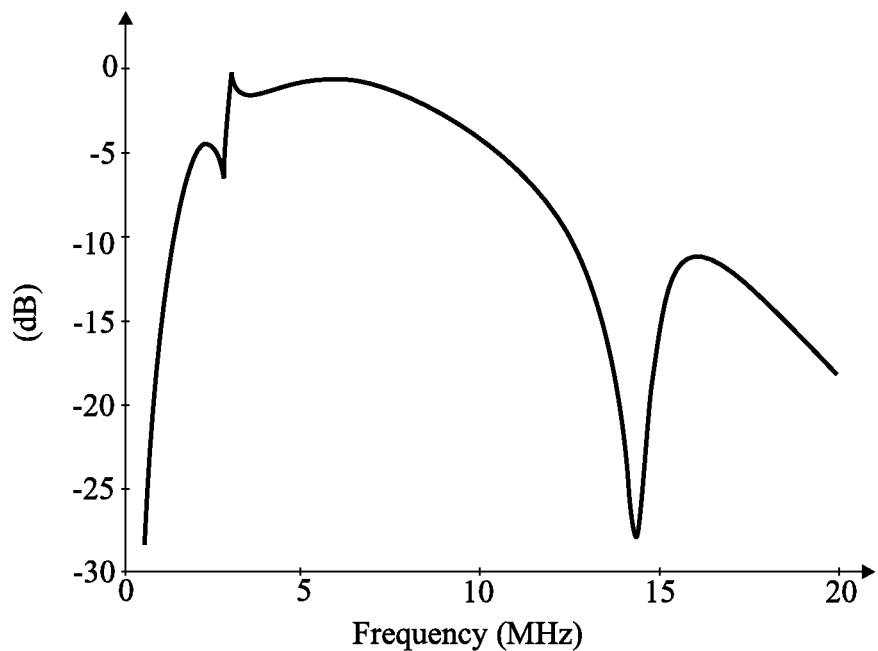
FIGS. 3A and 3B are plots illustrating the pressure frequency response of the first and second types of ultrasound transducers formed by the method of FIGS. 1A to 1C.
Figure 3B:
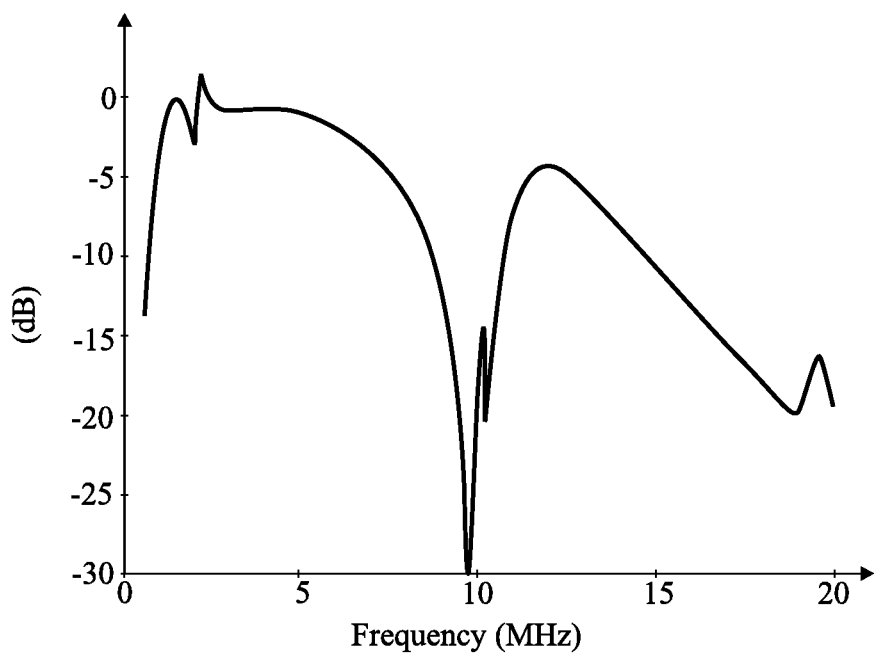

FIGS. 3A and 3B show the respective frequency responses of the type-I and -II transducers of the example of FIGS. 2A and 2B. More particularly, each of the diagrams of FIGS. 3A and 3B represents, for the corresponding transducer, the relative acoustic pressure transmitted by the transducer as measured on an output direction axis extending from the center of the transducer and at a far field distance from the transducer (in ordinates, in dB) during a transmit phase, according to the frequency of the AC excitation voltage applied between electrodes E1 and E2 of the transducer (in abscissas, in MHz).

FIG. 3A shows a broad bandwidth response at a central frequency in the order of from 6 to 7 MHz for the type-I transducer and, in FIG. 3B, a broad bandwidth response at a central frequency in the order of from 2 to 3 MHz for the type-II transducer.

In the shown example, for each transducer, the frequency response has been simulated for a DC bias voltage set to 80% of the transducer collapse voltage. It should be noted that in the considered example, the collapse voltage of the type-I transducer is of the same order of magnitude as the collapse voltage of the type-II transducer (in the order of 135 V in both cases). In practice, a similar resonance frequency shift can be observed when the DC bias voltage applied to the type-I transducer and the DC bias voltage applied to the type-II transducer are identical.

The provided method is particularly advantageous for the forming of multifrequency ultrasound imaging devices since it enables to monolithically form, on a same chip, transducers capable of operating at different frequencies. The fact for the formed transducers to be able to operate at different frequencies with a same DC bias voltage is particularly advantageous in such devices, since this enables to considerably simplify the electronic control circuits. Preferably, the DC bias voltage common to the different transducers is smaller than the collapse voltage of the transducers having the smallest collapse voltage, that is, the type-I transducers in the above-described example.

As a variant, the method described herein may be used to form, on a same substrate, transducers capable of operating at different frequencies and intended to be used in different devices after cutting of the substrate into individual chips (multi-project method).

Various embodiments and variants have been described. Those skilled in the art will understand that certain features of these various embodiments and variants may be combined, and other variants will occur to those skilled in the art. In particular, the described embodiments are not limited to the examples of dimensions and of materials mentioned in the present disclosure.

Further, the provided method may easily be adapted to simultaneously form, from a same substrate, a number greater than two of different transducer types capable of operating at different frequencies. For this purpose, different patterns of structured layer 109 and/or lateral dimensions of the cavities in transducers of different types may in particular be provided. Further, additional structured layers coating the transducer membranes may be provided to increase the number of available degrees of freedom. Preferably, all the transducers of the same type are identical, to within manufacturing dispersions.

Finally, the practical implementation of the described embodiments and variations is within the abilities of those skilled in the art based on the functional indications given hereabove. In particular, it will be within the abilities of those skilled in the art, by simulations or routine tests, to define the structuring patterns to be applied to layer 109 or 111 on type-I transducers to obtain the desired operating frequencies.

The invention claimed is:

1. A method of simultaneous manufacturing, from a same substrate, at least one first CMUT transducer having a first resonance frequency and at least one second CMUT transducer having a second resonance frequency different from the first frequency, the method comprising the successive steps of:
  a) for each transducer, forming a cavity on the upper surface side of the substrate, and forming a flexible membrane suspended above the cavity;
  b) forming a first layer extending over a portion only of the upper surface of the membrane of the first transducer and which does not extend over the membrane of the second transducer; and
  c) forming a second layer extending over the entire upper surface of the membrane of the first transducer and over the entire upper surface of the membrane of the second transducer,
  wherein the first layer and the second layers are electrically-conductive layers, or wherein the first layer and the second layer respectively are a dielectric layer and an electrically-conductive layer.

2. The method according to claim 1, wherein the first layer and the second layer are metal layers.

3. The method according to claim 1, wherein, at step a), each cavity is formed in a third dielectric layer previously formed on the upper surface of the substrate.

4. The method according to claim 3, wherein the membranes are formed in a fourth semiconductor layer placed on the upper surface of the third layer.

5. The method of claim 1, wherein the substrate is a semiconductor substrate.

6. The method according to claim 1, wherein the pattern formed by the first layer in the first transducer is arranged above a central portion of the transducer cavity.

7. The method according to claim 1, wherein the cavities of the first and second transducers formed at step a) have the same depth, to within manufacturing dispersions.

8. A device comprising, inside and on top of a same substrate, at least one first CMUT transducer having a first resonance frequency and at least one second CMUT transducer having a second resonance frequency different from the first frequency, wherein:
  each of the at least one first CMUT transducer and the at least one second CMUT transducer comprises a cavity on the upper surface side of the substrate, and a flexible membrane suspended above the cavity;
  a first layer extends over a portion only of the upper surface of the membrane of the at least one first CMUT transducer and does not extend over the membrane of the at least one second CMUT transducer; and
  a second layer extends over the entire upper surface of the membrane of the at least one first CMUT transducer and over the entire upper surface of the membrane of the at least one second CMUT transducer,
  wherein the first layer and the second layers are electrically-conductive layers, or wherein the first layer and the second layer respectively are a dielectric layer and an electrically-conductive layer.

9. A method of simultaneous manufacturing, from a same substrate, at least one first CMUT transducer having a first resonance frequency and at least one second CMUT transducer having a second resonance frequency different from the first frequency, the method comprising the steps of:
  a) for each transducer, forming a cavity on the upper surface side of the substrate, and forming a flexible membrane suspended above the cavity;
  b) forming a first layer extending over a portion only of the upper surface of the membrane of the first transducer and which does not extend over the membrane (105) of the second transducer; and
  c) forming a second layer extending over the entire upper surface of the membrane of the first transducer and over the entire upper surface of the membrane of the second transducer,
  wherein the first layer and the second layers are electrically-conductive layers, or wherein the first layer and the second layer respectively are a dielectric layer and an electrically-conductive layer.

10. The method according to claim 9, wherein the first layer and the second layer are metal layers.

11. The method according to claim 9, wherein, at step a), each cavity is formed in a third dielectric layer previously formed on the upper surface of the substrate.

12. The method according to claim 11, wherein the membranes are formed in a fourth semiconductor layer placed on the upper surface of the third layer.

13. The method of claim 9, wherein the substrate is a semiconductor substrate.

14. The method according to claim 9, wherein the pattern formed by the first layer in the first transducer is arranged above a central portion of the transducer cavity.

15. The method according to claim 9, wherein the cavities of the first and second transducers formed at step a) have the same depth, to within manufacturing dispersions.

* * * * *

UNITED STATES PATENT AND TRADEMARK OFFICE
CERTIFICATE OF CORRECTION

| | |
|---|---|
| PATENT NO. | : 12,172,187 B2 |
| APPLICATION NO. | : 17/636198 |
| DATED | : December 24, 2024 |
| INVENTOR(S) | : Nicolas Senegond, Dominique Gross and Cyril Meynier |

Page 1 of 1

It is certified that error appears in the above-identified patent and that said Letters Patent is hereby corrected as shown below:

In the Claims

Claim 9, Column 8, Line 41, Delete "(105)"

Signed and Sealed this
Fourth Day of February, 2025

Coke Morgan Stewart
*Acting Director of the United States Patent and Trademark Office*